(12) United States Patent
Xue et al.

(10) Patent No.: US 11,245,069 B2
(45) Date of Patent: *Feb. 8, 2022

(54) METHODS FOR FORMING STRUCTURES WITH DESIRED CRYSTALLINITY FOR MRAM APPLICATIONS

(71) Applicant: Applied Materials, Inc., Santa Clara, CA (US)

(72) Inventors: Lin Xue, Sunnyvale, CA (US); Jaesoo Ahn, Fremont, CA (US); Mahendra Pakala, Fremont, CA (US); Chi Hong Ching, Santa Clara, CA (US); Rongjun Wang, Dublin, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/199,006

(22) Filed: Jun. 30, 2016

(65) Prior Publication Data

US 2017/0018706 A1 Jan. 19, 2017

Related U.S. Application Data

(60) Provisional application No. 62/192,565, filed on Jul. 14, 2015.

(51) Int. Cl.
*H01L 43/12* (2006.01)
*H01L 43/08* (2006.01)
(Continued)

(52) U.S. Cl.
CPC ............ *H01L 43/12* (2013.01); *H01F 10/14* (2013.01); *H01F 10/3222* (2013.01); *H01L 43/08* (2013.01); *H01L 43/10* (2013.01)

(58) Field of Classification Search
CPC ......... H01L 43/12; H01L 43/10; H01L 43/08; H01L 43/02; H01F 10/14; H01F 10/3222
See application file for complete search history.

(56) References Cited

U.S. PATENT DOCUMENTS 6,964,928 B2  11/2005  Ying et al.
7,750,421 B2   7/2010  Horng et al.
(Continued)

FOREIGN PATENT DOCUMENTS

CN   101271958 A   9/2008
CN   102201533 A   9/2011

OTHER PUBLICATIONS

Chinese Office Action dated Dec. 22, 2020 for Application No. 201610554216.1.
(Continued)

*Primary Examiner* — Vongsavanh Sengdara
(74) *Attorney, Agent, or Firm* — Patterson + Sheridan, LLP

(57) ABSTRACT

Embodiments of the disclosure provide methods and apparatus for fabricating magnetic tunnel junction (MTJ) structures on a substrate in for spin-transfer-torque magnetoresistive random access memory (STT-MRAM) applications. In one embodiment, the method includes patterning a film stack having a tunneling barrier layer disposed between a magnetic reference layer and a magnetic storage layer disposed on a substrate to remove a portion of the film stack from the substrate until an upper surface of the substrate is exposed, forming a sidewall passivation layer on sidewalls of the patterned film stack and subsequently performing a thermal annealing process to the film stack.

22 Claims, 5 Drawing Sheets

(51) Int. Cl.
  *H01L 43/10* (2006.01)
  *H01F 10/14* (2006.01)
  *H01F 10/32* (2006.01)

(56) References Cited

U.S. PATENT DOCUMENTS

| | | | |
|---|---|---|---|
| 9,028,910 B2 | 5/2015 | Zhou et al. | |
| 2004/0101978 A1* | 5/2004 | Linn | H01F 41/303 |
| | | | 438/3 |
| 2009/0130779 A1* | 5/2009 | Li | H01L 43/08 |
| | | | 438/3 |
| 2009/0256220 A1* | 10/2009 | Horng | H01L 43/12 |
| | | | 257/421 |
| 2012/0326252 A1 | 12/2012 | Yamakawa et al. | |
| 2013/0175644 A1* | 7/2013 | Horng | G11C 11/161 |
| | | | 257/421 |
| 2014/0037991 A1* | 2/2014 | Abraham | H01L 43/08 |
| | | | 428/828.1 |
| 2014/0349413 A1* | 11/2014 | Chung | H01L 43/08 |
| | | | 438/3 |
| 2015/0255507 A1 | 9/2015 | Pakala et al. | |
| 2015/0263265 A1* | 9/2015 | Yoshikawa | H01L 43/02 |
| | | | 257/421 |
| 2016/0351799 A1 | 12/2016 | Xue et al. | |

OTHER PUBLICATIONS

Office Action for Taiwan Application No. 109119820 dated Jun. 25, 2021.
Search Report for Taiwan Application No. 109119820 dated May 23, 2021.
Taiwan Office Action dated Nov. 28, 2019 for Application No. 105122167.

* cited by examiner

METHODS FOR FORMING STRUCTURES WITH DESIRED CRYSTALLINITY FOR MRAM APPLICATIONS

CROSS-REFERENCE TO RELATED APPLICATIONS

This application claims benefit of U.S. Provisional Application Ser. No. 62/192,565 filed Jul. 14, 2015, which is incorporated by reference in its entirety.

FIELD

Embodiments of the disclosure relate to methods for fabricating structures used in magnetoresistive random access memory (MRAM) applications. More specifically, embodiments of the disclosure relate to methods for fabricating magnetic tunnel junction structures for MRAM applications.

BACKGROUND

Magnetoresistive random access memory (MRAM) is a type of memory device containing an array of MRAM cells that store data using their resistance values instead of electronic charges. Generally, each MRAM cell includes a magnetic tunnel junction (MTJ) structure. The MTJ structure may have adjustable resistance to represent a logic state "0" or "1." The MTJ structure typically includes a stack of magnetic layers having a configuration in which two ferromagnetic layers are separated by a thin non-magnetic dielectric, e.g., an insulating tunneling layer. A top electrode and a bottom electrode are utilized to sandwich the MTJ structure so electric current may flow between the top and the bottom electrode.

One ferromagnetic layer, e.g., a reference layer, is characterized by a magnetization with a fixed direction. The other ferromagnetic layer, e.g., a storage layer, is characterized by a magnetization with a direction that is varied upon writing of the device, such as by applying a magnetic field. In some devices, an insulator material, such as a dielectric oxide layer, may be formed as a thin tunneling barrier layer sandwiched between the ferromagnetic layers. The layers are typically deposited sequentially as overlying blanketed films. The ferromagnetic layers and the insulator material are subsequently patterned by various etching processes in which one or more layers are removed, either partially or totally, in order to form a device feature.

When the respective magnetizations of the reference layer and the storage layer are antiparallel, a resistance of the magnetic tunnel junction is high having a resistance value $R_{max}$ corresponding to a high logic state "1". On the other hand, when the respective magnetizations are parallel, the resistance of the magnetic tunnel junction is low, namely having a resistance value $R_{min}$ corresponding to a low logic state "0". A logic state of a MRAM cell is read by comparing its resistance value to a reference resistance value $R_{ref}$, which is derived from a reference cell or a group of reference cells and represents an in-between resistance value between that of the high logic state "1" and the low logic state "0".

One type of MRAM cell is spin-transfer-torque magnetic random access memory (STT-MRAM). While manufacturing conventional STT-MRAM devices, a thermal annealing process is often performed right after the film layer deposition process to assist crystallization of the ferromagnetic layers as well as the insulator material sandwiched in the device structure. Insufficient thermal energy or inaccurate temperature control during the annealing process may cause the film bonding structures or properties formed in an undesirable manner. For example, inaccurate temperature control or undesired drift of the thermal diffusion during the annealing process may result in insufficient crystallization of the film layer, leading to failure of the device to meet its intended performance.

Therefore, there is a need in the art for improved methods and apparatus for fabricating MTJ structures for MRAM applications.

SUMMARY

Embodiments of the disclosure provide methods and apparatus for fabricating magnetic tunnel junction (MTJ) structures on a substrate in MRAM applications, particularly for spin-transfer-torque magnetic random access memory (STT-MRAM) applications. In one embodiment, a film stack utilized to form a magnetic tunnel junction structure on a substrate includes a pinned layer disposed on a substrate, wherein the pinned layer comprises multiple layers including at least a Co containing layer, Pt containing layer, Ta containing layer a Ru containing layer and combinations thereof, an optional structure decoupling layer disposed on the pinned magnetic layer, a magnetic reference layer disposed on the optional structure decoupling layer, a tunneling barrier layer disposed on the magnetic reference layer, a magnetic storage layer disposed on the tunneling barrier layer, and a capping layer disposed on the magnetic storage layer.

In another embodiment, the method includes patterning a film stack having a tunneling barrier layer disposed between a magnetic reference layer and a magnetic storage layer disposed on a substrate to remove a portion of the film stack from the substrate until an upper surface of the substrate is exposed, forming a sidewall passivation layer on sidewalls of the patterned film stack and subsequently performing a thermal annealing process to the film stack.

In yet another embodiment, a method of forming a magnetic tunnel junction structure on a substrate includes patterning a film stack having a tunneling barrier layer disposed between a magnetic reference layer and a magnetic storage layer disposed on a substrate to remove a portion of the film stack from the substrate until an upper surface of the substrate is exposed, forming a sidewall passivation layer on sidewalls of the patterned film stack, forming an insulation layer in contact with the sidewall passivation layer on the substrate, and driving dopants from the magnetic reference layer and the magnetic storage layer laterally outward into the sidewall passivation layer by a thermal treatment process.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings.

To facilitate understanding, identical reference numerals have been used, where possible, to designate identical elements that are common to the figures. It is contemplated that elements disclosed in one embodiment may be beneficially utilized on other embodiments without specific recitation.

It is to be noted, however, that the appended drawings illustrate only typical embodiments of this disclosure and are therefore not to be considered limiting of its scope, for the disclosure may admit to other equally effective embodiments.

DETAILED DESCRIPTION

Embodiments of the disclosure generally provide apparatus and methods for forming MTJ structures from a film stack disposed on a substrate for MRAM applications. The apparatus and methods include forming the film properties of material layers from the film stack with desired crystallinity by a thermal process performed after the patterning of the material layers in the film stack. While patterning, a sidewall passivation layer may be formed along sidewalls of the film stack. Thus, by performing the thermal process after the patterning process and the sidewall passivation deposition process, the thermal energy provided from the thermal process may efficiency diffuse dopants into the material layers laterally outward toward the sidewall passivation layer, rather than vertically to adjacent material layers formed in the film stack. By doing so, a controllable degree of crystallinity of the material layers in the film stack may be obtained without damage or interference from the dopants that might potentially be cross-diffused from the adjacent materials. The film stack as patterned and annealed with desired degree of crystallinity may be used to form MTJ structures with desired dimension and features for MRAM applications.

Figure 1:
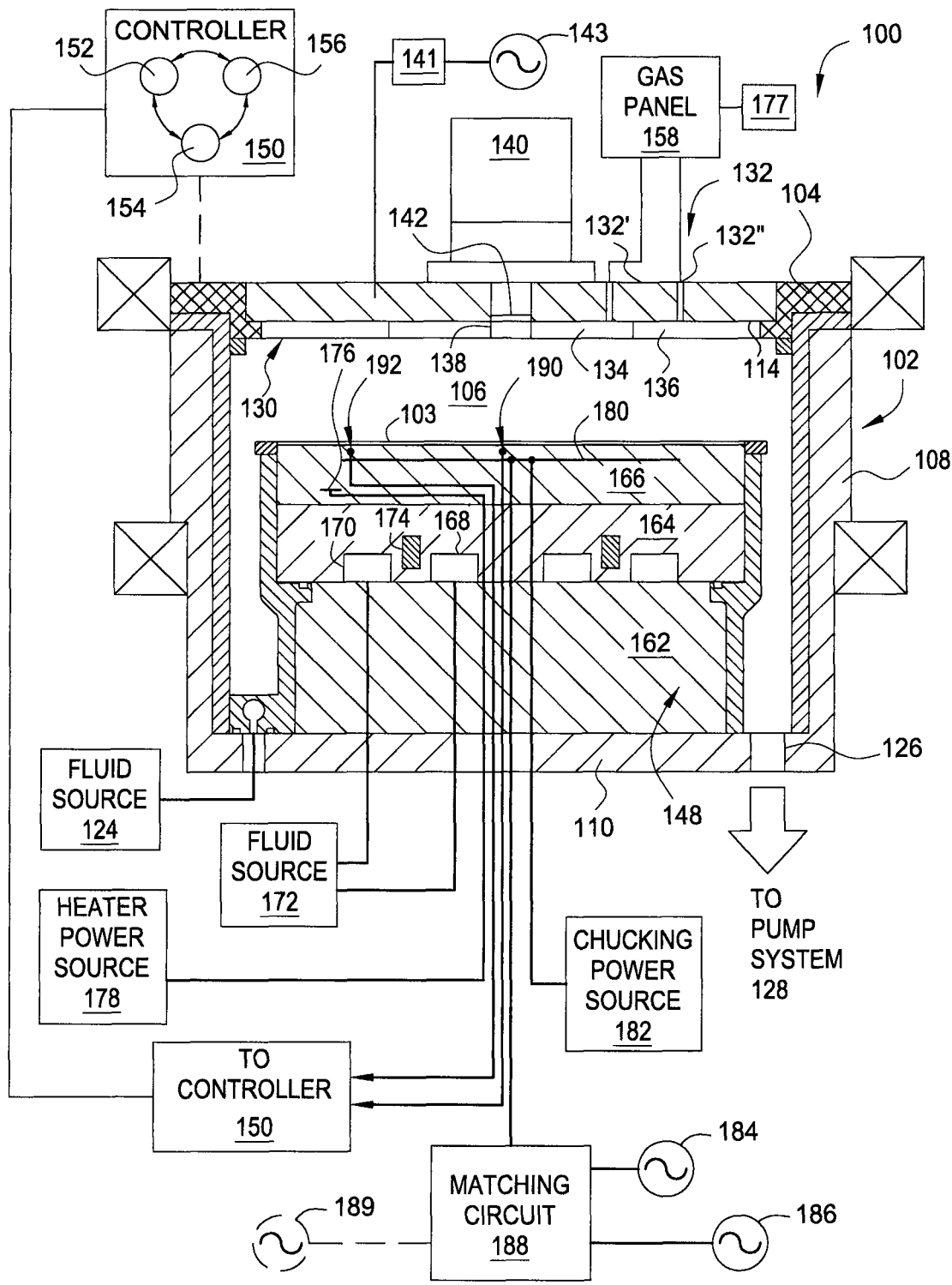
FIG. 1 depicts one embodiment of a plasma processing chamber for practice one embodiment of the present disclosure.

FIG. 1 is a sectional view of one example of a processing chamber 100 suitable for performing a patterning process to etch a film stack disposed on a substrate. Suitable processing chambers that may be adapted for use with the teachings disclosed herein include, for example, an ENABLER®, C3® or AdvantEdge Mesa® processing chamber available from Applied Materials, Inc. of Santa Clara, Calif. Although the processing chamber 100 is shown including a plurality of features that enable superior etching performance, it is contemplated that other processing chambers may be adapted to benefit from one or more of the inventive features disclosed herein.

The processing chamber 100 includes a chamber body 102 and a lid 104 which enclose an interior volume 106. The chamber body 102 is typically fabricated from aluminum, stainless steel or other suitable material. The chamber body 102 generally includes sidewalls 108 and a bottom 110. A substrate support pedestal access port (not shown) is generally defined in a sidewall 108 and a selectively sealed by a slit valve to facilitate entry and egress of a substrate 103 from the processing chamber 100. An exhaust port 126 is defined in the chamber body 102 and couples the interior volume 106 to a pump system 128. The pump system 128 generally includes one or more pumps and throttle valves utilized to evacuate and regulate the pressure of the interior volume 106 of the processing chamber 100. In one implementation, the pump system 128 maintains the pressure inside the interior volume 106 at operating pressures typically between about 10 mTorr to about 500 Torr.

The lid 104 is sealingly supported on the sidewall 108 of the chamber body 102. The lid 104 may be opened to allow excess to the interior volume 106 of the processing chamber 100. The lid 104 includes a window 142 that facilitates optical process monitoring. In one implementation, the window 142 is comprised of quartz or other suitable material that is transmissive to a signal utilized by an optical monitoring system 140 mounted outside the processing chamber 100.

The optical monitoring system 140 is positioned to view at least one of the interior volume 106 of the chamber body 102 and/or the substrate 103 positioned on a substrate support pedestal assembly 148 through the window 142. In one embodiment, the optical monitoring system 140 is coupled to the lid 104 and facilitates an integrated deposition process that uses optical metrology to provide information that enables process adjustment to compensate for incoming substrate pattern feature inconsistencies (such as thickness, and the like), provide process state monitoring (such as plasma monitoring, temperature monitoring, and the like) as needed. One optical monitoring system that may be adapted to benefit from the disclosure is the EyeD® full-spectrum, interferometric metrology module, available from Applied Materials, Inc., of Santa Clara, Calif.

A gas panel 158 is coupled to the processing chamber 100 to provide process and/or cleaning gases to the interior volume 106. In the example depicted in FIG. 1, inlet ports 132', 132" are provided in the lid 104 to allow gases to be delivered from the gas panel 158 to the interior volume 106 of the processing chamber 100. In one implementation, the gas panel 158 is adapted to provide fluorinated process gas through the inlet ports 132', 132" and into the interior volume 106 of the processing chamber 100. In one implementation, the process gas provided from the gas panel 158 includes at least a fluorinated gas, chlorine, and a carbon containing gas, an oxygen gas, a nitrogen containing gas and a chlorine containing gas. Examples of fluorinated and carbon containing gases include $CHF_3$, $CH_2F_2$ and $CF_4$. Other fluorinated gases may include one or more of $C_2F$, $C_4F_6$, $C_3F_8$ and $C_5F_8$. Examples of the oxygen containing gas include $O_2$, $CO_2$, $CO$, $N_2O$, $NO_2$, $O_3$, $H_2O$, and the like. Examples of the nitrogen containing gas include $N_2$, $NH_3$, $N_2O$, $NO_2$ and the like. Examples of the chlorine containing gas include $HCl$, $Cl_2$, $CCl_4$, $CHCl_3$, $CH_2Cl_2$, $CH_3Cl$, and the like. Suitable examples of the carbon containing gas include methane ($CH_4$), ethane ($C_2H_6$), ethylene ($C_2H_4$), and the like.

A showerhead assembly 130 is coupled to an interior surface 114 of the lid 104. The showerhead assembly 130 includes a plurality of apertures that allow the gases flowing through the showerhead assembly 130 from the inlet ports 132', 132" into the interior volume 106 of the processing chamber 100 in a predefined distribution across the surface of the substrate 103 being processed in the processing chamber 100.

A remote plasma source 177 may be optionally coupled to the gas panel 158 to facilitate dissociating gas mixture from a remote plasma prior to entering into the interior volume 106 for processing. A RF source power 143 is coupled through a matching network 141 to the showerhead assembly 130. The RF source power 143 typically is capable of producing up to about 3000 W at a tunable frequency in a range from about 50 kHz to about 200 MHz.

The showerhead assembly 130 additionally includes a region transmissive to an optical metrology signal. The optically transmissive region or passage 138 is suitable for allowing the optical monitoring system 140 to view the interior volume 106 and/or the substrate 103 positioned on the substrate support pedestal assembly 148. The passage 138 may be a material, an aperture or plurality of apertures formed or disposed in the showerhead assembly 130 that is substantially transmissive to the wavelengths of energy generated by, and reflected back to, the optical monitoring system 140. In one embodiment, the passage 138 includes a window 142 to prevent gas leakage through the passage 138. The window 142 may be a sapphire plate, quartz plate or other suitable material. The window 142 may alternatively be disposed in the lid 104.

In one implementation, the showerhead assembly 130 is configured with a plurality of zones that allow for separate control of gas flowing into the interior volume 106 of the processing chamber 100. In the example illustrated in FIG. 1, the showerhead assembly 130 as an inner zone 134 and an outer zone 136 that are separately coupled to the gas panel 158 through separate inlet ports 132', 132".

The substrate support pedestal assembly 148 is disposed in the interior volume 106 of the processing chamber 100 below the gas distribution (showerhead) assembly 130. The substrate support pedestal assembly 148 holds the substrate 103 during processing. The substrate support pedestal assembly 148 generally includes a plurality of lift pins (not shown) disposed therethrough that are configured to lift the substrate 103 from the substrate support pedestal assembly 148 and facilitate exchange of the substrate 103 with a robot (not shown) in a conventional manner. An inner liner 118 may closely circumscribe the periphery of the substrate support pedestal assembly 148.

In one implementation, the substrate support pedestal assembly 148 includes a mounting plate 162, a base 164 and an electrostatic chuck 166. The mounting plate 162 is coupled to the bottom 110 of the chamber body 102 includes passages for routing utilities, such as fluids, power lines and sensor leads, among others, to the base 164 and the electrostatic chuck 166. The electrostatic chuck 166 comprises at least one clamping electrode 180 for retaining the substrate 103 below showerhead assembly 130. The electrostatic chuck 166 is driven by a chucking power source 182 to develop an electrostatic force that holds the substrate 103 to the chuck surface, as is conventionally known. Alternatively, the substrate 103 may be retained to the substrate support pedestal assembly 148 by clamping, vacuum or gravity.

At least one of the base 164 or electrostatic chuck 166 may include at least one optional embedded heater 176, at least one optional embedded isolator 174 and a plurality of conduits 168, 170 to control the lateral temperature profile of the substrate support pedestal assembly 148. The conduits 168, 170 are fluidly coupled to a fluid source 172 that circulates a temperature regulating fluid therethrough. The heater 176 is regulated by a power source 178. The conduits 168, 170 and heater 176 are utilized to control the temperature of the base 164, thereby heating and/or cooling the electrostatic chuck 166 and ultimately, the temperature profile of the substrate 103 disposed thereon. The temperature of the electrostatic chuck 166 and the base 164 may be monitored using a plurality of temperature sensors 190, 192. The electrostatic chuck 166 may further comprise a plurality of gas passages (not shown), such as grooves, that are formed in a substrate support pedestal supporting surface of the chuck 166 and fluidly coupled to a source of a heat transfer (or backside) gas, such as He. In operation, the backside gas is provided at controlled pressure into the gas passages to enhance the heat transfer between the electrostatic chuck 166 and the substrate 103.

In one implementation, the substrate support pedestal assembly 148 is configured as a cathode and includes an electrode 180 that is coupled to a plurality of RF power bias sources 184, 186. The RF bias power sources 184, 186 are coupled between the electrode 180 disposed in the substrate support pedestal assembly 148 and another electrode, such as the showerhead assembly 130 or ceiling (lid 104) of the chamber body 102. The RF bias power excites and sustains a plasma discharge formed from the gases disposed in the processing region of the chamber body 102.

In the example depicted in FIG. 1, the dual RF bias power sources 184, 186 are coupled to the electrode 180 disposed in the substrate support pedestal assembly 148 through a matching circuit 188. The signal generated by the RF bias power sources 184, 186 is delivered through matching circuit 188 to the substrate support pedestal assembly 148 through a single feed to ionize the gas mixture provided in the plasma processing chamber 100, thereby providing ion energy necessary for performing a deposition or other plasma enhanced process. The RF bias power sources 184, 186 are generally capable of producing an RF signal having a frequency of from about 50 kHz to about 200 MHz and a power between about 0 Watts and about 5000 Watts. An additional bias power source 189 may be coupled to the electrode 180 to control the characteristics of the plasma.

In one mode of operation, the substrate 103 is disposed on the substrate support pedestal assembly 148 in the plasma processing chamber 100. A process gas and/or gas mixture is introduced into the chamber body 102 through the showerhead assembly 130 from the gas panel 158. A vacuum pump system 128 maintains the pressure inside the chamber body 102 while removing deposition by-products.

A controller 150 is coupled to the processing chamber 100 to control operation of the processing chamber 100. The controller 150 includes a central processing unit (CPU) 152, a memory 154, and a support circuit 156 utilized to control the process sequence and regulate the gas flows from the gas panel 158. The CPU 152 may be any form of general purpose computer processor that may be used in an industrial setting. The software routines can be stored in the memory 154, such as random access memory, read only memory, floppy, or hard disk drive, or other form of digital storage. The support circuit 156 is conventionally coupled to the CPU 152 and may include cache, clock circuits, input/output systems, power supplies, and the like. Bi-directional communications between the controller 150 and the various components of the processing chamber 100 are handled through numerous signal cables.

Figure 2:
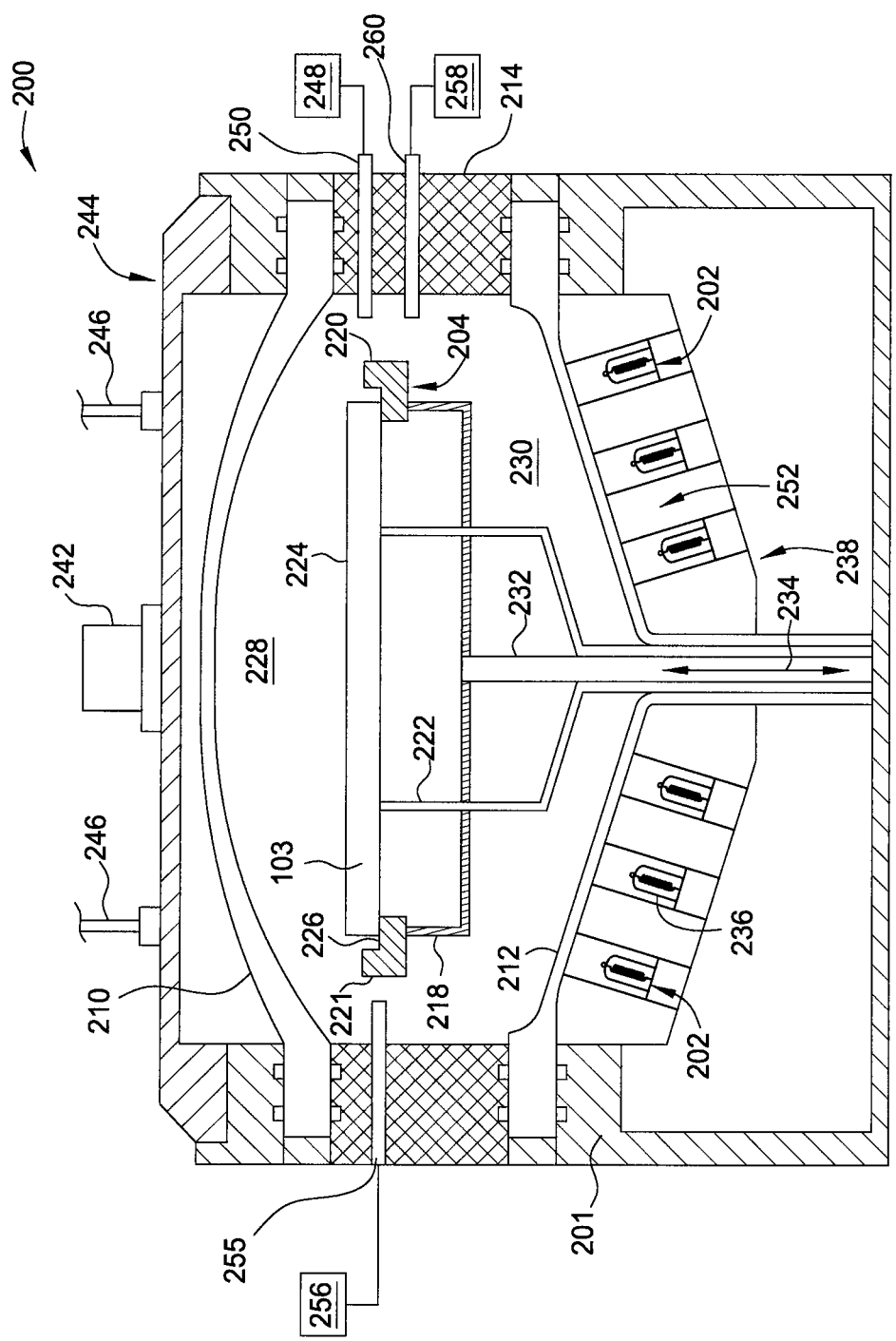
FIG. 2 depicts one embodiment of an annealing chamber for practice one embodiment of the present disclosure.

FIG. 2 illustrates a schematic view of a processing chamber 200 according to one embodiment. The processing chamber 200 may be used to process the substrate 103, including providing thermal/heat energy to material layers disposed on the substrate 103. The processing chamber 200 may include an array of radiant heating lamps 202 for heating, among other components, a back side 204 of a susceptor 220 disposed within walls 201 of the processing chamber 200, and the substrate 103. The susceptor 220 is supported by a susceptor support 218. In the embodiment shown in FIG. 2, the susceptor 220 has a ring shaped body with a central opening 203 and a lip 221 that extends from the edge of the susceptor 220 and circumscribes the central opening 203. The lip 221 and the front side 202 of the susceptor 220 create a pocket 226 that supports the substrate 103 from the edge of the substrate to facilitate exposure of the substrate 103 to the thermal radiation provided by the lamps 202.

The susceptor 220 is located within the processing chamber 200 between an upper dome 210 and a lower dome 212. The upper dome 210 is coupled to the lower dome 212 by a base ring 214. The upper dome 210, the lower dome 212 and the base ring 214 generally define an internal region of the processing chamber 200. In some embodiments, the array of radiant heating lamps 202 may be disposed over the upper dome 210. The substrate 301 can be brought into the processing chamber 200 and positioned onto the susceptor 220 through a loading port (not shown) formed in the base ring 214.

The susceptor 220 is shown in an elevated processing position, but may be moved vertically by an actuator (not shown) to a loading position below the processing position to allow lift pins 222 to pass through holes in the susceptor support 218, and raise the substrate 103 from the susceptor 220. A robot (not shown) may then enter the processing chamber 200 to engage and remove the substrate 103 therefrom though the loading port. The susceptor 220 then may be actuated up to the processing position to place the substrate 103, with a device side 224 facing up, on a front side 202 of the susceptor 220.

The susceptor 220 and the susceptor support 218, while located in the processing position, divide the internal volume of the processing chamber 200 into a process gas region 228 that is above the substrate 103, and a purge gas region 230 below the susceptor 220 and the susceptor support 218. The susceptor 220 and susceptor support 218 are rotated during processing by a supporting cylindrical central shaft 232, to minimize the effect of thermal and process gas flow spatial anomalies within the processing chamber 200, and thus facilitate uniform processing of the substrate 103. The central shaft 232 moves the substrate 301 in an up and down direction 234 during loading and unloading, and in some instances, during processing of the substrate 103.

In general, the central window portion of the upper dome 210 and the bottom of the lower dome 212 are formed from an optically transparent material, such as quartz. One or more lamps, such as an array of the lamps 202, can be disposed adjacent to and beneath the lower dome 212 in a specified, optimal desired manner around the central shaft 232 to independently control the temperature at various regions of the substrate 103. The heated substrate 103 is exposed to the process gases, thereby facilitating the thermal processing (i.e., deposition) of a material onto the upper surface of the substrate 103.

The lamps 202 may be configured to include bulbs 236 and may be configured to heat the substrate 301 to a temperature within a range of about 200 degrees Celsius to about 1600 degrees Celsius, for example, between about 300 degrees Celsius to about 1200 degrees Celsius or between about 500 to about 580 degrees Celsius. Each lamp 202 is coupled to a power distribution board (not shown) through which power is supplied to each lamp 202. The lamps 202 are positioned within a lamphead 238 which may be cooled during or after processing by, for example, a cooling fluid introduced into channels 252 located between the lamps 202. The lamphead 238 conductively and radiantly cools the lower dome 212 due in part to the close proximity of the lamphead 238 to the lower dome 212. The lamphead 238 may also cool the lamp walls and walls of the reflectors (not shown) around the lamps. Alternatively, the lower dome 212 may be cooled by a convective approach known, such as by fans or other cooling techniques. Depending upon the application, the lampheads 238 may or may not be in contact with the lower dome 212. As a result of backside heating of the substrate 103, the use of an optical pyrometer 242 for temperature measurements/control on the substrate 103 and the susceptor 220 may also be utilized.

A reflector 244 may be optionally placed outside the upper dome 210 to reflect infrared light that is radiating off the substrate 301 back onto the substrate 301. The reflector 244 may be fabricated from a metal such as aluminum or stainless steel. The efficiency of the reflection can be improved by coating a reflector area with a highly reflective coating, such as with gold. The reflector 244 can have one or more machined channels 246 connected to a cooling source (not shown). The channel 246 connects to a passage (not shown) formed on a side of the reflector 244. The passage is configured to carry a flow of a fluid such as water and may run horizontally along the side of the reflector 244 in any desired pattern covering a portion or entire surface of the reflector 244 for cooling the reflector 244.

Process gas supplied from a process gas supply source 248 is introduced into the process gas region 228 through a process gas inlet 250 formed in the sidewall of the base ring 214. The process gas inlet 250 is configured to direct the process gas in a generally radially inward direction. During the film formation process, the susceptor 220 may be located in the processing position, which is adjacent to and at about the same elevation as the process gas inlet 250, allowing the process gas to flow up and round along a flow path across the upper surface of the substrate 103 in a laminar flow. The process gas exits the process gas region 228 through a gas outlet 255 located on the side of the processing chamber 200 opposite the process gas inlet 250. Removal of the process gas through the gas outlet 255 may be facilitated by a vacuum pump 256 coupled thereto. As the process gas inlet 250 and the gas outlet 255 are aligned and disposed approximately at the same elevation, it is believed that such a parallel arrangement, when combined with a flatter upper dome 210 provides generally planar, uniform gas flow across the substrate 103. Further radial uniformity may be provided by the rotation of the substrate 103 by the susceptor 220.

Purge gas may be supplied from a purge gas source 258 to the purge gas region 230 through an optional purge gas inlet 260 (or through the process gas inlet 250) formed in the sidewall of the base ring 214. The purge gas inlet 260 is disposed at an elevation below the process gas inlet 250. The purge gas inlet 260 is configured to direct the purge gas in a generally radially inward direction. During the process, the susceptor 220 may be located at a position such that the purge gas flows down and along a flow path across the back side 204 of the susceptor 220 in a laminar flow. Without being bound by any particular theory, the flowing of the purge gas is believed to prevent or substantially avoid the flow of the process gas from entering into the purge gas region 230, or to reduce diffusion of the process gas entering the purge gas region 230 (i.e., the region under the susceptor 220). The purge gas exits the purge gas region 230 and is exhausted out of the processing chamber 200 through the gas outlet 255, which is located on the side of the processing chamber 200 opposite the purge gas inlet 260.

Figure 3:
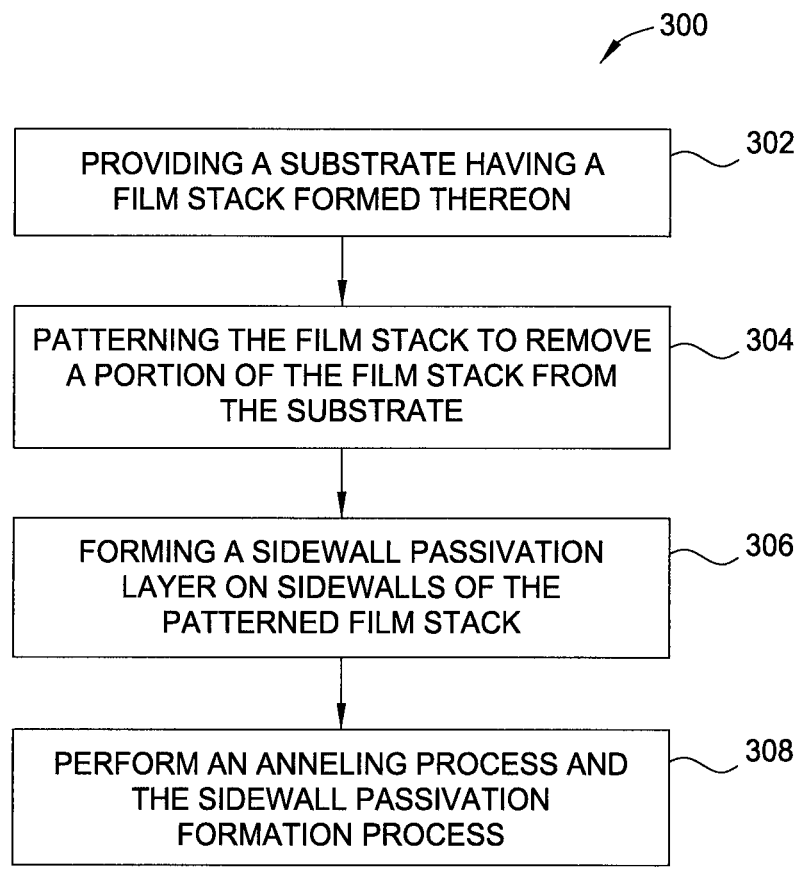
FIG. 3 depicts a flow diagram illustrating a method for fabricating magnetic tunnel junction (MTJ) structures according to one embodiment of the present disclosure.

FIG. 3 depicts a flow diagram illustrating a process 300 for manufacturing MTJ structures on a substrate for MRAM applications according to one embodiment of the present disclosure. FIGS. 4A-4E are schematic cross-sectional views of a substrate 400 at various stages of the process of FIG. 3. The process 300 is configured to be performed in a plasma processing chamber and a thermal processing chamber, such as the processing chambers 100, 200 as described in FIGS. 1 and 2. It is contemplated that the process 300 may be performed in other suitable plasma immersion ion implantation systems or etching chamber, including those from other manufacturers.

Figure 4A:
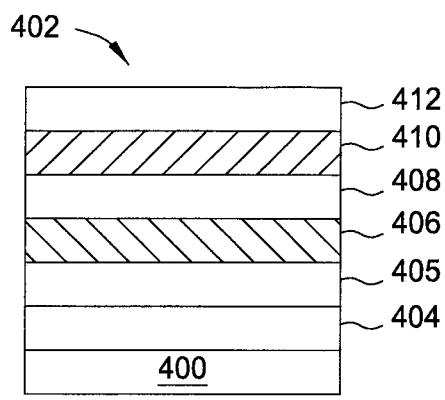
FIGS. 4A-4E are schematic side views of a substrate at various stages of the method of FIG. 3.
Figure 5:
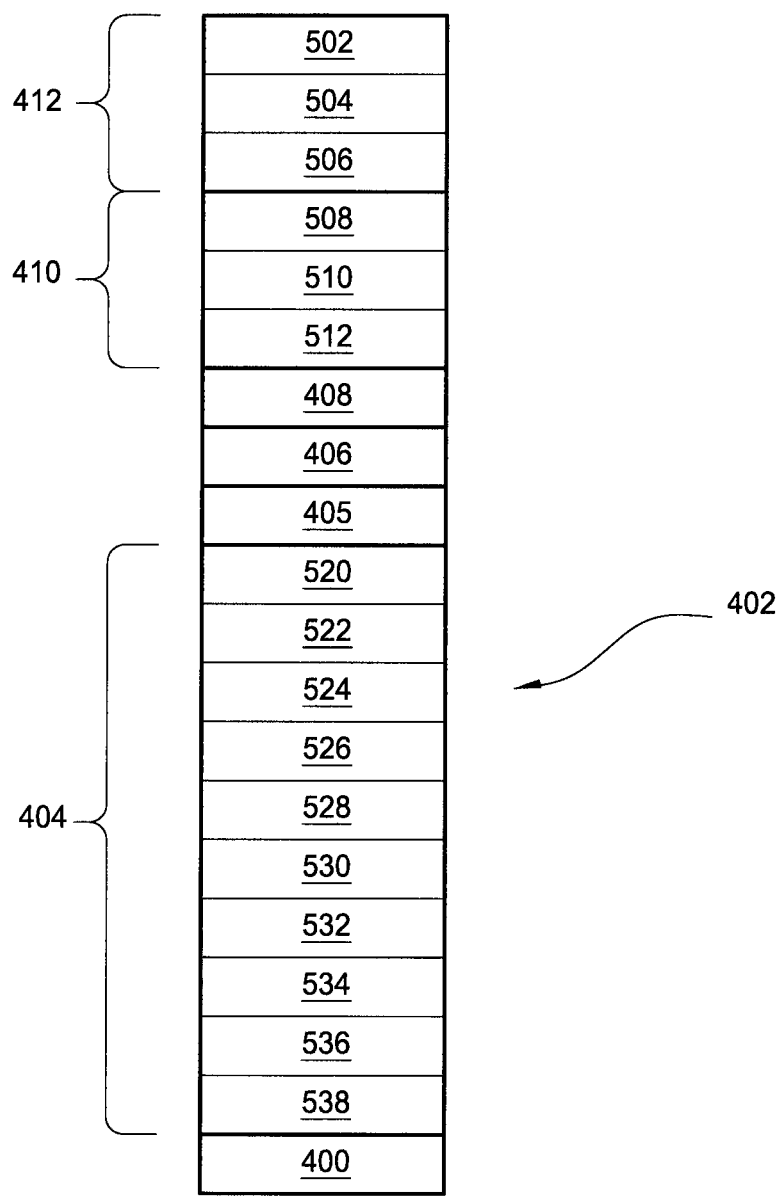
FIG. 5 is a schematic diagram of another embodiment of a portion of the film stack illustrated in FIG. 4A.

The process 300 begins at operation 302 by providing a substrate, such as the substrate 400 having a film stack 402 disposed thereon. FIG. 5 is a schematic diagram of one embodiment of a portion of the film stack 402 illustrated in FIG. 4A. In one embodiment, the substrate 400 comprises metal or glass, silicon, dielectric bulk material and metal alloys or composite glass, crystalline silicon (e.g., Si<100> or Si<111>), silicon oxide, strained silicon, silicon germanium, germanium, doped or undoped polysilicon, doped or undoped silicon wafers and patterned or non-patterned wafers silicon on insulator (SOI), carbon doped silicon oxides, silicon nitride, doped silicon, germanium, gallium arsenide, glass, or sapphire. The substrate 400 may have various dimensions, such as 200 mm, 300 mm, 450 mm or other diameter, as well as, being a rectangular or square panel. Unless otherwise noted, examples described herein are conducted on substrates with a 200 mm diameter, a 300 mm diameter, or a 450 mm diameter substrate. In one embodiment, the substrate 400, as shown in FIG. 4A, includes the film stack 402 disposed on the substrate 400.

In one example, the film stack 402 includes a pinned magnetic layer 404, an optional structure decoupling layer 405 and a tunneling barrier layer 408, which may be an oxide barrier layer in the case of a tunnel junction magnetoresistive (TMR) sensor or a conductive layer in the case of a giant magnetoresistive (GMR) sensor, disposed above the pinned magnetic layer 404 sandwiched between a magnetic storage layer 410 and a magnetic reference layer 406. When the film stack 402 is configured to form a TMR sensor, then the tunneling barrier layer 408 may comprise MgO, $HfO_2$, $TiO_2$, $TaO_x$, $Al_2O_3$, or other suitable materials. In the embodiment depicted in FIG. 5, the tunneling barrier layer 408 may comprise MgO having a thickness of about 1 to about 15 Angstroms, such about 10 Angstroms. The tunneling barrier layer 408 may be annealed either during or post deposition, for example, using a rapid thermal anneal (RTP) process.

If the film stack 402 is configured to form a GMR sensor, film stack 402 may comprise a non-magnetic conductive material, such as copper. The structure decoupling layer 405 may be a metal containing material or a magnetic material, such as Mo, Ta, W, CoFe, CoFeB and the like.

In one example, the pinned magnetic layer 404 may have a thickness of about 2 nm. The pinned magnetic layer 404 may comprise one of several types of pinned layers, such as a simple pinned, antiparallel pinned, self pinned or antiferromagnetic pinned sensor. The pinned magnetic layer 404, the magnetic storage layer 410 and the magnetic reference layer 406 may be constructed of several magnetic materials such as a metal alloy with dopants, such as boron dopants, oxygen dopants or other suitable materials. Metal alloys may be a nickel containing material, platinum containing material, ru containing material, a cobalt containing material, tantalum containing materials and palladium containing materials. Suitable examples of the magnetic materials include Ru containing layer, Ta, Co, Pt, TaN, $NiFeO_x$, NiFeB, $CoFeO_xB$, CoFeB, CoFe, $NiO_xB$, $CoBO_x$, $FeBO_x$, CoFeNiB, CoPt, CoPd, $TaO_x$ and the like.

In the embodiment depicted in FIG. 4A, the magnetic storage layer 410 may be a CoFeB, CoFeNiB, Ta, Mo or W, combinations thereof or other suitable layer(s). For example, in the embodiment depicted in FIG. 5, the magnetic storage layer 410 includes a first CoFeB layer 508 and a second CoFeB layer 512 sandwiching an intermediate layer 510. The first and second CoFeB layers 508, 512 may have a thickness of about 5 to about 20 Angstroms, for example about 10 Angstroms, a composition of B in the range of about 10 to about 30 percent, and a composition of Fe in the range of about 20 to about 60 percent. The intermediate layer 510 may include one or more layers of at least one or more of Ta, Mo and W. The intermediate layer 510 may have a thickness of about 0 to about 10 Angstroms, for example about 3 Angstroms.

The magnetic reference layer 406 may be CoFeB or other suitable layer. The magnetic reference layer 406 may have a thickness of about 5 to about 20 Angstroms, for example about 10 Angstroms. The magnetic reference layer 406 may have a composition of about 10 to about 30 percent of boron (B), and about 20 to about 60 percent Fe.

The structure decoupling layer 405 is disposed between the magnetic reference layer 406 and the pinned magnetic layer 404. The structure decoupling layer 405 may include one or more layers of at least one or more of Ta, Mo and W. The structure decoupling layer 405 may have a thickness of about 0 to about 10 Angstroms, for example about 3 Angstroms.

The pinned magnetic layer 404 may include one or more layers. In the example depicted in FIG. 5, the pinned magnetic layer 404 sequentially includes a Co layer 520, a Co/Pt layer 522, an Ru layer 524, a Co layer 526, a Co/Pt layer 528, a Pt layer 530, a Ta layer 532, an Ru layer 534, a Ta layer 536 and a TaN layer 538. The Co layer 520 may have a thickness of about 0 to about 10 Angstroms, for example about 5 Angstroms. The Ru layer 524 may have a thickness of about 3 to about 10 Angstroms, for example about 4-5 or about 7-9 Angstroms. The Co layer 526 may have a thickness of about 0 to about 10 Angstroms, for example about 5 Angstroms. The Pt layer 530, the Ta layer 532, the Ru layer 534, the Ta layer 536 and the TaN layer 538 each may have a thickness of about 0 to about 5 Angstroms, for example about 3 Angstroms.

The Co/Pt layer 522 may have a composition comprising $[Co_{(x1)}/Pt_{(y1)}]_m$, with $x_1$ having a thickness of Co of between about 1 to about 6 Angstroms, $y_1$ having a thickness of Pt of between about 1 Angstroms to about 10 Angstroms, for example about 1-8 Angstroms, and m having a number of between 0 and 5, where m represents the numbers of the Co/Pt layer 522 repeatedly formed in the film stack. For example, when $x_1$ is 5 Angstroms and $y_1$ is 3 Angstroms and m is number 2, it represents a film stack of Co layer (5 Angstroms)/Pt layer (3 Angstroms)/Co layer (5 Angstroms)/Pt layer (3 Angstroms).

The Co/Pt layer 528 may have a composition comprising [Co(x)/Pt(y)]n, with x having a thickness of about 1 to about 6 Angstroms, y having a thickness of about 1 to about 10 Angstroms, for example about 1-8 Angstroms, and n having a number of between 3 and 10.

A capping layer 412 is then formed on the magnetic storage layer 410 in the film stack 402. In one embodiment, the capping layer 412 may include a magnetic layer. Suitable examples of the capping layer 412 include one or more layers of at one or more of CoFeB, MgO, Ta and Ru. In the example depicted in FIG. 5, the capping layer 412 includes a first layer 502 and a second layer 506 sandwiching an intermediate layer 504. The first layer 502 may have a thickness of about 0 to about 5 nanometers (nm), for example about 2 nm. The first layer 502 may include one or more layers comprised of Ta and/or Ru. The second layer

506 may comprise MgO, and have a thickness of about 0 to about 15 Angstroms, for example 7 Angstroms. The intermediate layer 504 may include CoFeB. The intermediate layer 504 may have a thickness of about 0 to about 50 Angstroms, for example about 10 Angstroms. The intermediate layer 504 may have a composition of about 10 to about 30 percent B, and about 20 to about 60 percent Fe.

It is noted that the pinned magnetic layer 404, the optional structure decoupling layer 405, the tunneling barrier layer 408, the magnetic storage layer 410, the magnetic reference layer 406 and the capping layer 412 may be formed by any suitable techniques, such as CVD, PVD, ALD, spin-coating, spray coating, and any suitable manners. One example of systems that may be used to form these layers includes CENTURA®, PRECISION 5000® and PRODUCER® deposition systems, all available from Applied Materials Inc., Santa Clara, Calif. It is contemplated that other processing system, including those available from other manufacturers, may be adapted to practice the disclosure.

Figure 4B:
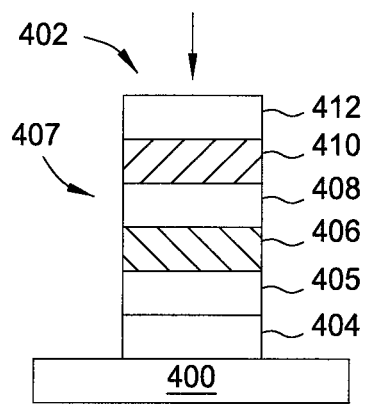

At operation 304, a patterning process, e.g., an etching process, is performed to remove a portion 407 of the film stack 402 exposed and defined by an etching mask layer (not shown) from the substrate 301, until the underlying substrate 400 is exposed, as shown in FIG. 4B. The patterning process for patterning the film stack 402 may include several steps or different recipes configured to supply different gas mixtures or etchants to etch different layers in accordance with the materials included in each layer.

During patterning, an etching gas mixture or several gas mixtures with different etching species are sequentially supplied into the substrate surface to remove the portion of the film stack 402 from the substrate 400.

The end point of the patterning process at operation 304 may be controlled by time or other suitable methods. For example, the patterning process may be terminated after performing for between about 200 seconds and about 10 minutes until the substrate 400 is exposed, as shown in FIG. 4B. The patterning process may be terminated by determination from an endpoint detector, such as an OES detector or other suitable detector as needed.

At operation 306, after the patterning process, a sidewall passivation layer 414 is formed on sidewalls 415 of the patterned film stack 402, such as the sidewalls of the pinned magnetic layer 404, the optional structure decoupling layer 405, the tunneling barrier layer 408, the magnetic storage layer 410, the magnetic reference layer 406 and the capping layer 412.

In one example, the sidewall passivation layer 414 may be a dielectric layer formed by a deposition process performed after the patterning process at operation 304. For example, the sidewall passivation layer 414 may be formed by a CVD deposition, PVD deposition, ALD deposition, or other suitable deposition processes as needed. The sidewall passivation layer 414 may be formed from a nitrogen containing material, carbon containing material, or oxide containing material. Suitable exemplary materials for forming the sidewall passivation layer 414 includes SiN, SiCN, SiO$_2$, SiON, SiC, amorphous carbon, SiOC, aluminum oxide (Al$_2$O$_3$), aluminum nitride (AlN), and the like.

In another example, the sidewall passivation layer 414 may be formed from by-products generated during the pattering process at operation 304 accumulating on the sidewalls of the film stack 402 after the patterning process at operation 304. For example, during patterning, a carbon containing gas, an oxygen containing gas, or a nitrogen containing gas may be utilized in the etching gas mixture during the patterning process. The carbon elements, oxygen elements and the nitrogen elements from these gases may react with elements from the film stack 402, forming side-products, residuals or build-ups adhering on the sidewalls 415 of the film stack 402. Thus, in the example wherein the sidewall passivation layer 414 are formed from the patterning process from operation 304, the gases supplied in the etching gas mixture at operation 304 may include at least one of carbon containing gas, oxygen containing gas, or nitrogen containing gas.

Figure 4C:
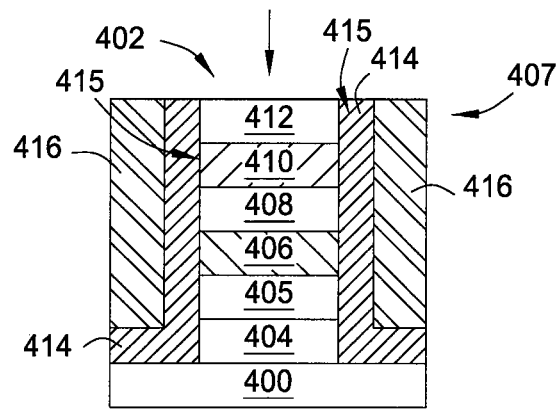

After the sidewall passivation layer 414 is formed on the sidewalls 415 of the film stack 402, a further deposition process may be performed to form an insulation layer 416 on the portion 407 of the substrate 400 where the film stack 402 was removed during the pattering process at operation 304, as shown in FIG. 4C. The insulation layer 416 may be any suitable insulating materials that may later under series of etching and deposition processes to form interconnection structure (e.g., a backend process) in the insulation layer 416 to complete the device structure fabrication process. In one example, the insulation layer 416 is a silicon oxide layer or other suitable material.

Figure 4D:
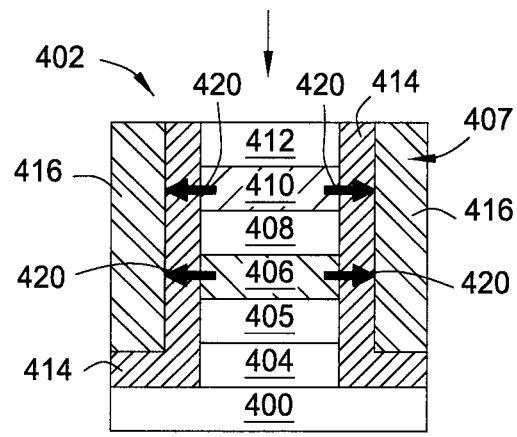

At operation 308, after the patterning process at operation 304 is completed and the sidewall passivation layer and the insulation layer 416 is formed on the substrate 400, a thermal annealing process may be performed. The thermal annealing process is performed to repair, densify and enhance lattice structures of the film stack 402, particularly the magnetic storage layer 410 and the magnetic reference layer 406 included in the film stack 402. For example, after the thermal/annealing process, the magnetic storage layer 410 and the magnetic reference layer 406 may have stronger crystalline structures of (111), (220) and (311) plane peaks under XRD analysis prior to, e.g., without, the thermal/annealing process, thus enhancing crystallinity of the magnetic storage layer 410 and the magnetic reference layer 406 formed therein. During the annealing process, dopants from the magnetic storage layer 410 and the magnetic reference layer 406 are laterally driven away from the magnetic storage layer 410 and the magnetic reference layer 406, as shown by the arrow 420, to the sidewall passivation layer 414, as shown in FIG. 4D. By forming a sidewall passivation layer 414 between the insulation layer 416 and the film stack 402, the dopants from the magnetic storage layer 410 and the magnetic reference layer 406 may be efficiently retained laterally proximate to the sidewall passivation layer 414, rather than vertically moving towards the capping layer 412, the tunneling barrier layer 408 or the pinned magnetic layer 404 or the optional structure decoupling layer 405 formed in the film stack 402. Lateral diffusion, rather than vertical diffusion, of the dopants may efficiently control the dopants from drifting to the sidewall passivation layer 414 so that the film properties and crystallinity of the layers in the film stack 402 will not be adversely impacted or altered. For example, in the embodiment wherein boron (B) dopants are included in the magnetic storage layer 410 and the magnetic reference layer 406, during the annealing process, boron dopants may be laterally diffused to the sidewall passivation layer 414, forming boron compounds (such as boron oxide, boron nitride, or boron carbide, depending on the materials utilized to form the sidewall passivation layer 414), which is a relatively stable compound that would not significantly alter electrical performance of the devices. Undesired dopant diffusion to the magnetic storage layer 410 and the magnetic reference layer 406 may result in with inaccurate magnetization or undesired atom spin directions when applying a magnetic field, thus adversely affecting the overall performance of the MTJ devices.

Thus, by utilizing the thermal annealing process performed after the patterning process and/or after the sidewall passivation and/or insulation layer deposition process, a more stable magnetization process and a better control of the dopant diffusion process may be obtained, as compared to the conventional practices having the annealing process performed right after each layer is formed in the film stack or right after the film stack 402 is formed on the substrate 400.

In one example, the annealing process may be performed after the pattering process at operation 304 without or prior to forming the sidewall passivation layer 414 and the insulation layer 416. In another example, the annealing process may be performed after the pattering process at operation 304 and the sidewall passivation and/or insulation layer deposition process at operation 306 as needed.

The thermal annealing process may be performed in a thermal annealing chamber, such as the processing chamber 200 depicted in FIG. 2. Alternatively, the annealing process may be performed in any processing chamber configured to provide enough thermal energy to the film stack 402 disposed on the substrate 400. In one embodiment, the thermal annealing process may be performed in-situ process in the processing chamber wherein the patterning process at operation 304 or the deposition process at operation 306 was performed. The thermal annealing process may heat the substrate 400 to a temperature greater than 200 degrees Celsius, such as between about 250 degrees Celsius and about 550 degree Celsius, to assist dopants in the magnetic storage layer 410 and the magnetic reference layer 406 to diffuse outward and laterally from the film stack and enhance crystallinity of the magnetic storage layer 410 and the magnetic reference layer 406, and other layers in the film stack 402.

During annealing, an annealing gas mixture may be supplied. Gases that may be supplied in the annealing gas mixture may include a nitrogen containing gas, such as $NH_3$, $N_2$, $NF_3$, $N_2O$, $NO_2$, NO and the like, an inert gas, such as Ar, He, Ne, Kr, Xe or the like, or an oxygen containing gas, such as $O_2$, $O_3$, $N_2O$, $H_2O$, $CO_2$, CO and the like.

Alternatively, the annealing process may also be performed after the interconnection fabrication process (e.g., the back end fabrication process) is performed. It is noted that the interconnection fabrication process (e.g., the back end fabrication process) referred herein includes processes of patterning the insulation layer 416 to form trenches or vias in the insulation layer 416 and later having a conductive layer formed in trenches or vias defined in the insulation layer 416. The temperature configured to perform the annealing process right after the deposition of the insulation layer 416 or sidewall passivation layer 414 deposition process at operation 306 and after the interconnection fabrication process (e.g., the back end fabrication process) may be the same or different. In one example, the temperature for the thermal annealing process configured to perform after the interconnection fabrication process (e.g., the back end fabrication process) may be slightly lower than the temperature of the thermal annealing process performed right after the deposition of the insulation layer 416 or sidewall passivation layer 414 deposition process at operation 306.

Figure 4E:
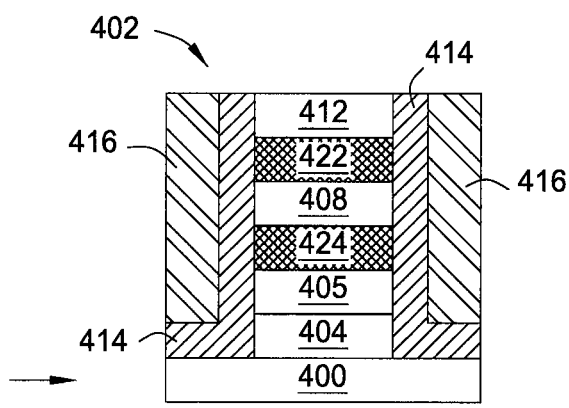

After the thermal annealing process, the magnetic storage layer 410 and the magnetic reference layer 406 may be turned into a crystallized magnetic storage layer 422 and a crystallized magnetic reference layer 424, as shown in FIG. 4E, having crystal orientation mostly in one plane. The thermal energy provides during the thermal annealing process assists crystallizing the magnetic storage layer 410 and the magnetic reference layer 406 and other layers in the film stack 402 from amorphous state into crystalline state, thus efficiency enhancing magnetization of the film layers included in the film stack 402. The thermal energy provided during the thermal annealing process at operation 308 assist growing the grains from the amorphous state into large sizes into crystallized grains, enhancing crystallinity of the magnetic storage layer 410 and the magnetic reference layer 406, and other layers in the film stack 402. As desired crystallization of the magnetic storage layer 410 and the magnetic reference layer 406 is obtained, the overall electrical properties of the film stack 402 for manufacturing MTJ devices are improved.

Accordingly, processes and apparatus of forming MTJ device structures for MRAM are provided. The process advantageously provides a method to thermal anneal, e.g., thermal treat, a film stack utilized to form the MTJ devices. The thermal annealing process performed after the film stack deposition, patterning and sidewall passivation and insulation layer deposition process may efficiently crystallize the layers in the film stack in a manner (e.g., lateral diffusion rather than vertical diffusion) without damaging or impacting the film properties of the adjacent layers formed in the film stack. By doing so, the film stack utilized to form the MTJ structure may have a desired dopant profile and electrical performance and magnetization.

While the foregoing is directed to embodiments of the disclosure, other and further embodiments of the disclosure may be devised without departing from the basic scope thereof.

What is claimed is:

1. A film stack utilized to form a magnetic tunnel junction structure on a substrate, comprising:
   a pinned layer disposed on the substrate, wherein the pinned layer comprises multiple layers including at least one or more layers selected from the group consisting of a Co containing layer, Pt containing layer, Ta containing layer, and an Ru containing layer;
   a structure decoupling layer disposed on the pinned layer fabricated from at least one of Mo or W;
   a magnetic reference layer disposed on the structure decoupling layer;
   a tunneling barrier layer disposed on the magnetic reference layer;
   a magnetic storage layer disposed on the tunneling barrier layer;
   a capping layer disposed on the magnetic storage layer;
   a sidewall passivation layer in direct contact with sidewalls of the film stack, the sidewall passivation layer extending from the capping layer to the pinned layer, wherein the sidewall passivation layer is conformally in direct contact with a top surface of the substrate, the sidewall passivation layer having a vertical portion continuously coplanar along a vertical axis normal to a major axis of the substrate and a horizontal portion in direct contact with the substrate; and
   an insulation layer formed on and in direct contact with the sidewall passivation layer, wherein the insulation layer extends from a top surface of the sidewall passivation layer to the horizontal portion of the sidewall passivation.

2. The film stack of claim 1, wherein the capping layer includes at least a Ta containing or Ru containing layer disposed on a Co containing layer.

3. The film stack of claim 2, wherein the capping layer comprises the Co containing layer disposed on a Mg containing layer.

4. The film stack of claim 2, wherein the capping layer comprises the Ta containing or Ru containing layer disposed on a Mo containing layer.

5. The film stack of claim 1, wherein the multiple layers included in the pinned layer comprises in total 10 layers.

6. The film stack of claim 1, wherein the Co containing layer in the pinned layer is a CoFeB layer.

7. The film stack of claim 1, wherein the magnetic storage layer comprises at least two Co containing layers sandwiching a layer including at least one of Ta, Mo or W containing materials.

8. The film stack of claim 1, wherein the tunneling barrier layer is selected from a group consisting of MgO, $HfO_2$, $TiO_2$, $TaO_x$ and $Al_2O_3$.

9. The film stack of claim 1, wherein the magnetic reference layer is CoFeB.

10. The film stack of claim 1, wherein the capping layer includes a magnetic layer.

11. The film stack of claim 10, wherein the magnetic layer is selected from a group consisting of CoFeB, MgO, Ta and Ru.

12. The film stack of claim 1, wherein the pinned layer comprises a TaN layer in direct contact with the substrate.

13. The film stack of claim 1, wherein the sidewall passivation layer is fabricated from a material selected from a group consisting of SiN, SiCN, SiO2, SiON, SiC, amorphous carbon, SiOC, Al2O3 and AlN.

14. The film stack of claim 1, wherein the structure decoupling layer further comprises at least one of CoFe and CoFeB.

15. The film stack of claim 1, wherein the capping layer comprises a Ru containing layer disposed on a Ta containing layer.

16. The film stack of claim 1, wherein the insulation layer comprises SiO2.

17. The film stack of claim 1, wherein a trench, a via, or both are disposed in the insulation layer.

18. The film stack of claim 1, wherein the Co containing layer of the pinned layer has a thickness of between about 0 Angstroms and about 10 Angstroms.

19. The film stack of claim 1, wherein the Ru containing layer of the pinned layer has a thickness of between about 3 Angstroms and about 10 Angstroms.

20. The film stack of claim 1, wherein the Pt containing layer of the pinned layer has a thickness of between about 0 Angstroms and about 5 Angstroms.

21. The film stack of claim 1, wherein the Ta containing layer of the pinned layer has a thickness of between about 0 and about 5 Angstroms.

22. The film stack of claim 1, wherein the pinned layer further comprises multiple layers including at least one or more layers selected from the group consisting of a Ni containing layer, a Pd containing layer, and an FeBO containing layer.

* * * * *